(12) United States Patent
Naumann et al.

(10) Patent No.: US 7,166,530 B2
(45) Date of Patent: Jan. 23, 2007

(54) METHOD OF FORMING CONTACT PADS

(75) Inventors: Ronald Naumann, Dresden (DE);
Volker Grimm, Langebrueck (DE);
Tino Meinhold, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/196,024

(22) Filed: Aug. 3, 2005

(65) Prior Publication Data
US 2006/0141758 A1    Jun. 29, 2006

(30) Foreign Application Priority Data
Dec. 28, 2004   (DE)   ...................... 10 2004 063 036

(51) Int. Cl.
*H01L 21/44* (2006.01)
*H01L 21/311* (2006.01)

(52) U.S. Cl. ...................... 438/612; 438/613; 438/700; 438/707; 438/710

(58) Field of Classification Search ........ 438/612–614, 438/637, 700, 702, 707, 710, 713
See application file for complete search history.

(56) References Cited

U.S. PATENT DOCUMENTS 6,271,115 B1 *   8/2001   Liu et al. ..................... 438/618

2005/0160575 A1 *   7/2005   Gambino et al. .......... 29/602.1

FOREIGN PATENT DOCUMENTS

| DE | 197 30 322 A1 | 1/1998 |
| JP | 10154720 A | 6/1998 |
| JP | 2004179486 A | 6/2004 |

* cited by examiner

*Primary Examiner*—Hsien-Ming Lee
(74) *Attorney, Agent, or Firm*—Williams, Morgan & Amerson, P.C.

(57) ABSTRACT

In a method of forming a semiconductor structure, a substrate comprising at least one contact pad is provided. A passivation layer is formed over the substrate. A mask which does not cover a portion of the passivation layer located over the at least one contact pad is formed over the passivation layer. An etching process adapted to remove a material of the passivation layer is performed and the mask is removed. Then, a second etching process adapted to remove residues of the passivation layer from the contact pad can be performed. The removal of the mask may be performed at a temperature of the substrate in a range from about −20° C. to about 100° C. The second etching process can comprise exposing the substrate to a gaseous etchant comprising hydrogen and fluorine, an amount of hydrogen in the etchant being about equal to an amount of fluorine, or greater. Thus, a formation of oxides and/or fluorides on the at least one contact pad can be avoided.

45 Claims, 3 Drawing Sheets

METHOD OF FORMING CONTACT PADS

BACKGROUND OF THE INVENTION

1. Field of the Invention

The present invention relates to the formation of integrated circuits, and, more particularly, to the formation of contact pads for providing electrical connections to a semiconductor structure.

2. Description of the Related Art

Integrated circuits comprise a large number of individual circuit elements such as, e.g., transistors, capacitors and resistors formed on a substrate. These elements are connected internally by means of electrically conductive lines to form complex circuits, such as memory devices, logic devices and microprocessors. In order to accommodate all the electrically conductive lines required to connect the circuit elements in modern integrated circuits, the electrically conductive lines are arranged in a plurality of levels stacked on top of each other. In order to electrically connect the integrated circuit with other electronic components, input terminals and output terminals are provided.

A method of forming an electrical connection to a semiconductor structure according to the state of the art will now be described with reference to FIGS. 1a–1c. A semiconductor structure 100 comprises a substrate 101 which may be, e.g., a semiconductor wafer on which a plurality of circuit elements and electrically conductive lines connecting the circuit elements have been formed. At a surface of the substrate 102, a contact pad 103 is provided. The substrate 101 comprising the contact pad 103 may be formed by means of advanced techniques of deposition, oxidation, ion implantation and photolithography known to persons skilled in the art.

On the substrate 101, a passivation layer 104 is formed, for example by means of plasma enhanced chemical vapor deposition or chemical vapor deposition. The passivation layer 104 may comprise a dielectric material such as, e.g., silicon nitride, silicon oxynitride or silicon dioxide. The passivation layer 104 prevents moisture from entering the semiconductor structure 100. Thus, electric leakage and corrosion which might lead to a failure of electronic circuits in the semiconductor structure 100 can be significantly reduced.

A mask 105 is formed over the passivation layer 104. The mask 105 does not cover a portion of the passivation layer 104 located over the contact pad 103. The mask 105 may comprise a photoresist. The mask 105, when comprising a photoresist, can be formed by applying the photoresist to the semiconductor structure 100, exposing the photoresist through a reticle and solving either the portions irradiated in the exposure or the non-irradiated portions in a developer.

A schematic sketch of the semiconductor structure in a later stage of the method according to the state of the art is shown in FIG. 1b. After the formation of the mask 105, a first etching process is performed. The first etching process can be a dry etching process. In dry etching, a radio frequency glow discharge produces a chemically reactive species such as atoms, radicals, and ions from a relatively inert molecular gas supplied to a reaction vessel. The reactive species react chemically with the material to be etched, creating a volatile reaction product.

The mask 105 protects portions of the passivation layer 104 covered by the mask 105 from being affected by an etchant used in the first etching process. The portions of the passivation layer 104 over the contact pad 103 which are not covered by the mask 105, however, are etched, and a recess 106 is formed in the passivation layer 104.

The first etching process is stopped prior to a complete removal of the portion of the passivation layer 104 over the contact pad 103. Thus, a residue 107 of the passivation layer 104 remains at the bottom of the recess 106 over the contact pad 103.

Thereafter, the mask 105 is removed by means of a plasma resist stripping process. In the plasma resist stripping process, the semiconductor structure 100 is exposed to a plasma generated by an electric discharge in a gas comprising oxygen. The semiconductor structure is held at a temperature significantly higher than room temperature, for example, 200–300° C. Oxygen radicals in the plasma react chemically with the material of the mask 105, creating a gaseous reaction product which is pumped off.

One purpose of maintaining the residue 107 of the passivation layer 104 over the contact pad 103 is to serve as a protective coating of the contact pad 103 preventing a contact between the oxygen radicals in the plasma and the contact pad 103 in order to avoid an undesirable oxidation of the contact pad 103.

Due to fluctuations in the formation of the passivation layer 104 and/or the etching process performed in the formation of the recess 106, however, a thickness and/or density of parts of the residue 107 of the passivation layer 104 may not be sufficient to prevent a contact between oxygen and the contact pad 103. At the process conditions applied in the conventional resist strip, the contact pad 103, when comprising a metal such as, e.g., copper, oxidizes quickly once it is exposed to oxygen. In particular, the relatively high temperature of 200° C. or more promotes the oxidation of metal. Moreover, since diffusion is a thermally activated process, at high temperature, oxygen diffuses more quickly through permeable portions of the residue 107 of the passivation layer, which further increases the likelihood of an oxidation of the contact pad 103 to occur. Therefore, an oxidized region 108 may form on the surface of the contact pad 103.

A schematic cross-sectional view of the semiconductor structure 100 in a further stage of the manufacturing process according to the state of the art is shown in FIG. 1c. A second etching process is performed in order to remove the residue 107 of the passivation layer 104 from the contact pad 103. The second etching process can be a dry etching process. Conventionally, in the second etching process, an etching gas comprising trifluoromethane ($CHF_3$) and carbon tetrafluoride ($CF_4$) is used. A flow rate of the trifluoromethane is about the same as a flow rate of the carbon tetrafluoride. Thus, an amount of fluorine in the etching gas is greater than an amount of hydrogen in the etching gas. In the second etching process, a polymer layer is formed over a surface of the contact pad 103 which substantially protects the contact pad from being affected by the fluorine in the etching gas.

In the second etching process, or in other steps of the manufacturing process performed thereafter, a flaking of material layers present in the semiconductor structure 100 may occur. This flaking can adversely affect the functionality of the semiconductor structure 100. Moreover, in the first etching process, the removal of the mask and/or the second etching process, contamination layers comprising by-products of chemical reactions, for example polymers formed in the etching processes, may be deposited on the walls of the reaction vessels. Particles may flake off from such contamination layers, in particular in the second etching process, and can be deposited on the semiconductor structure 100, as indicated by reference numeral 109 in FIG. 1c.

After the second etching process, the contact pad 103 is exposed and may be used to provide electrical contact between the semiconductor structure 100 and other electronic components. For example, this may be done by bonding electrically conductive wires to the contact pad 103 and to other contact pads in the semiconductor structure 100. Alternatively, flip chip methods wherein bumps are formed on the contact pads may be used to bond the semiconductor structure 100 to a circuit board.

A problem of the method of providing electrical contact to a semiconductor structure according to the state of the art is that, in the resist strip process, oxidized regions may form on the contact pad 103. Since the contact pad 103 comprises a metal (copper, for example), and metal oxides, such as copper oxide, are electrical insulators, the presence of the oxidized regions may cause a relatively large contact resistivity between the contact pad 103 and the wire or bump connected thereto. Moreover, oxides on the contact pads 103 may reduce an adhesion between the contact pads and the wires or bumps. This may lead to a reduced stability of the connection.

Another problem of the method of providing electrical contact to a semiconductor structure according to the state of the art is that, in the second etching process, a flaking of layers of the semiconductor structure 100 may occur, which can adversely affect the functionality of the semiconductor structure 100.

Yet another problem of the method of providing electrical contact to a semiconductor structure according to the state of the art is that, in the second etching process, particles comprising by-products of chemical reactions may flake off the walls of the reaction vessels and can be deposited on the semiconductor structure. In order to at least reduce such a deposition of particles, the reaction vessel has to be cleaned frequently in order to remove the by-products from the walls of the reaction vessel. Such cleaning processes, however, increase the downtime of the etching apparatus, which may adversely affect the production costs of semiconductor structures.

In view of the above problems, there is a need for a more reliable method of forming contact pads for providing electrical contact to an integrated circuit.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a method of forming a semiconductor structure comprises providing a substrate. The substrate comprises at least one contact pad. A passivation layer is formed over the substrate. A mask is formed over the passivation layer. The mask does not cover a portion of the passivation layer located over the at least one contact pad. An etching process adapted to remove a material of the passivation layer is performed. The mask is removed. The removal of the mask comprises exposing the substrate to a gas comprising oxygen. The removal of the mask is performed at a temperature of the substrate in a range from about −20° C. to about 100° C.

According to another illustrative embodiment of the present invention, a method of forming a semiconductor structure comprises providing a substrate. The substrate comprises at least one contact pad. A passivation layer is formed over the substrate. A mask is formed over the passivation layer. The mask does not cover a portion of the passivation layer located over the at least one contact pad. A first etching process adapted to remove a material of the passivation layer is performed. The mask is removed. A second etching process adapted to remove residues of the passivation layer from the at least one contact pad is performed. The second etching process comprises exposing the substrate to a gaseous etchant comprising hydrogen and fluorine. An amount of hydrogen in the etching gas is about equal to an amount of fluorine in the etching gas, or greater.

BRIEF DESCRIPTION OF THE DRAWINGS

The invention may be understood by reference to the following description taken in conjunction with the accompanying drawings, in which like reference numerals identify like elements, and in which.

Figure 1A:
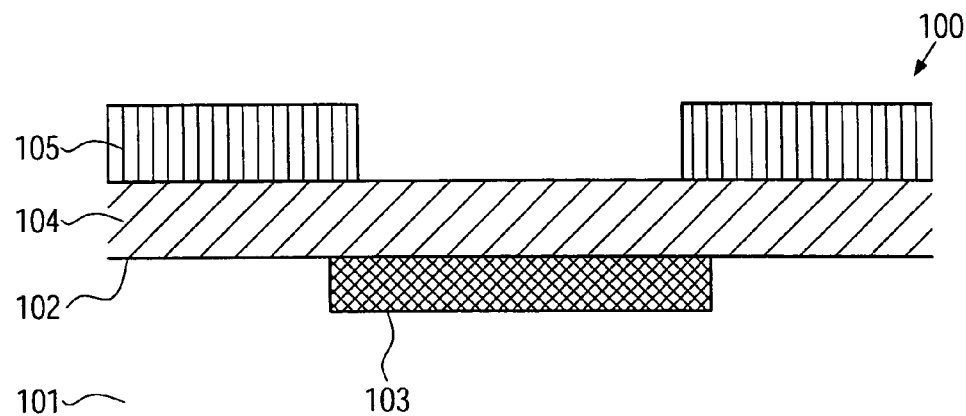
FIGS. 1a–1c show schematic cross-sectional views of a semiconductor structure in a method of forming a semiconductor structure according to the state of the art.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In some embodiments of a method of forming a semiconductor structure according to the present invention, a removal of a mask used in the etching of a passivation layer over a contact pad is performed at a substrate temperature in a range from about −20° C. to about 100° C. Due to the relatively low temperature, an oxidation of the contact pad can advantageously be significantly reduced.

Moreover, in some embodiments of a method of forming a semiconductor structure according to the present invention, in an etching process performed to remove residues of a passivation layer from at least one contact pad, an etching gas comprising hydrogen and fluorine is used. An amount of hydrogen in the etching gas is about equal to an amount of fluorine in the etching gas, or greater. The residues of the passivation layer may have been left on the contact pad in order to avoid an oxidation of a material of the contact pad in the removal of a mask. The hydrogen in the etching gas, which may be present in the form of molecular hydrogen or in a chemically bound form, reacts with excess fluorine in the etching gas. Thus, gaseous hydrogen fluoride (HF) is formed which may be pumped out of the reaction chamber. This helps avoid adverse effects of the presence of fluorine such as a flaking of layers of the semiconductor structure, or adverse effects of a contamination layer on the walls of the reaction vessels.

Figure 2A:
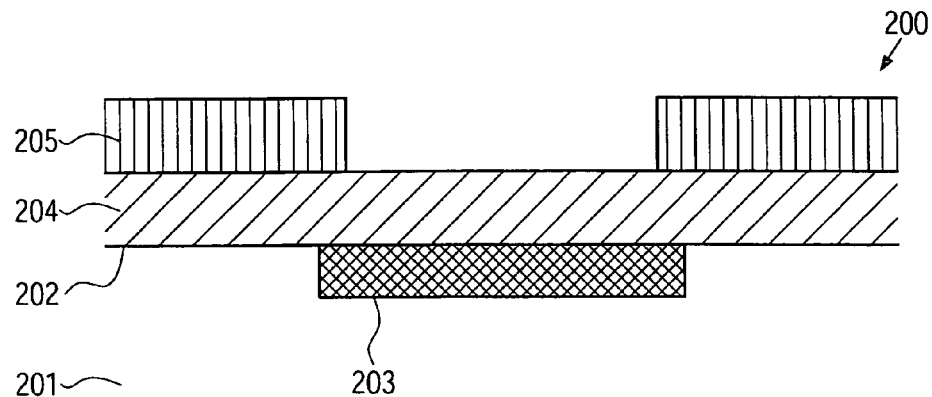
FIGS. 2a–2d show schematic cross-sectional views of a semiconductor structure in a method of forming a semiconductor structure according to the present invention.

Further illustrative embodiments of the present invention will now be described with reference to FIGS. 2a–2d. FIG. 2a shows a schematic cross-sectional view of a semiconductor structure 200 in a first stage of a manufacturing process according to the present invention. The semiconductor structure 200 comprises a substrate 201. The substrate 201 comprises a contact pad 203 which can be provided at a surface 202 of the substrate 201.

Additionally, the substrate 201 may comprise further contact pads (not shown) similar to the contact pad 203. Hence, the substrate 201 comprises at least one contact pad. The substrate 201 may also comprise a plurality of circuit elements such as, e.g., transistors, capacitors and resistors connected by electrically conductive lines (not shown). These circuit elements can be provided under the contact pad 203 and/or under the surface 202 of the substrate. At least some of the circuit elements may be electrically connected to the contact pad 203.

The at least one contact pad 203 may comprise an electrically conductive material, for example a metal such as copper. The substrate 201 can be formed by means of advanced known techniques comprising deposition, oxidation, ion implantation, photolithography and polishing. In particular, the contact pad 203 may be formed by means of a damascene process known to persons skilled in the art.

Figure 1B:
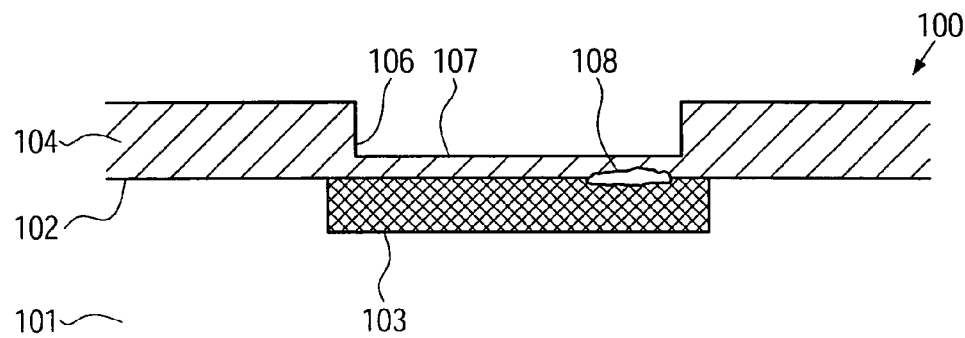
Figure 1C:
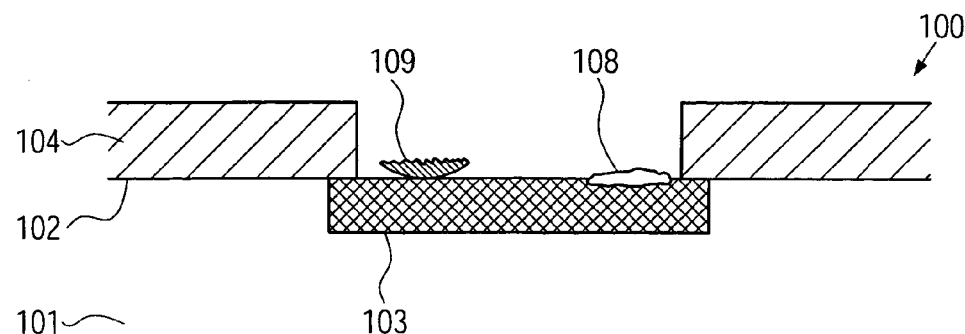

A passivation layer 204 is formed over the substrate 201. This can be done by means of known deposition techniques comprising plasma enhanced chemical vapor deposition or chemical vapor deposition. The passivation layer 204 may comprise a dielectric material, for example silicon nitride and/or silicon oxynitride. Similar to the passivation layer 104 in the method according to the prior art described above with reference to FIGS. 1a–1c, the passivation layer 204 prevents moisture from entering into the semiconductor structure 200. Thus, the likelihood of an electrical leakage in and failure of the semiconductor structure 200 may be significantly reduced.

The passivation layer 204 can comprise a single layer of a material. In other embodiments of the present invention, the passivation layer 204 may comprise a stack of a plurality of layers comprising different materials.

A mask 205 is formed over the substrate 201. The mask 205 may comprise a photoresist and can be formed by means of known techniques of photolithography. The mask does not cover a portion of the passivation layer 204 located over the contact pad 203. Additionally, the mask 205 may expose portions of the passivation layer 204 located over other contact pads in the substrate 201.

Figure 2B:
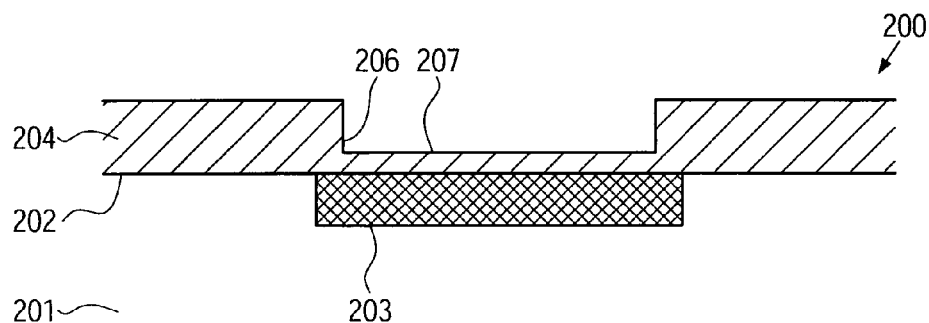

A schematic sketch of the semiconductor structure 200 in a later stage of the manufacturing process is shown in FIG. 2b. A first etching process adapted to remove a material of the passivation layer 204 is performed. The first etching process can be a dry etching process.

Figure 3:
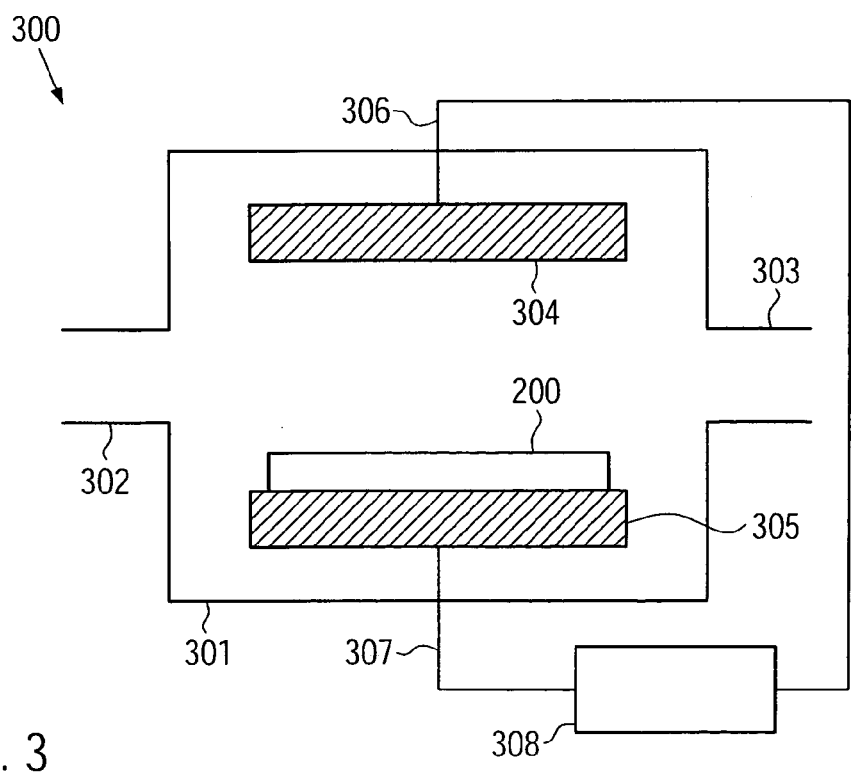
FIG. 3 shows a schematic cross-sectional view of a reactor adapted for etching processes and processes for removing a mask according to the present invention.

FIG. 3 shows a reactor 300 wherein a dry etching process can be performed. The reactor 300 comprises a vessel 301 having an inlet 302 and an outlet 303. The inlet 302 may be connected to a gas source adapted to provide an etching gas to the vessel 301. The outlet 303 may be connected to a vacuum pump adapted to control a pressure in the vessel 301 and to remove unconsumed etching gas and products of chemical reactions occurring in the vessel 301.

In the vessel 301, a first electrode 304 and a second electrode 305 are provided. The electrodes 304, 305 are connected to a power source 308 by wires 306, 307. The power source 308 is adapted to apply a radio frequency alternating voltage to the electrodes 304, 305. Additionally, the power source 308 may be adapted to apply a bias voltage, which can be a direct voltage or a low frequency alternating voltage to the electrodes 304, 305.

In the operation of the reactor 300, the semiconductor structure 200 is provided on, or in the vicinity of, one of the electrodes 304, 305, for example the second electrode 305. Then, an etching gas is flowed into the vessel 301 through the inlet 302. Subsequently, the power source 308 is activated to apply the radio frequency alternating voltage and, optionally, the bias voltage, to the electrodes 304, 305. Thus, an electric discharge is created in the etching gas. The electric discharge creates reactive species which may react with materials of the semiconductor structure 200. The bias voltage may accelerate ions in the plasma generated by the electric discharge towards the semiconductor structure 200. Thus, the semiconductor structure 200 is exposed to an ion bombardment which can contribute to the removal of material from the semiconductor structure 200.

In the first etching process, the etching gas is adapted such that reactive species reacting with the material of the passivation layer 204 are created. For example, in an embodiment of the present invention wherein the passivation layer 204 comprises silicon nitride, silicon oxynitride and/or silicon dioxide, known etch chemistries comprising carbon fluorides or fluorinated hydrocarbons can be used. Products of the reaction between the reactive species and the material of the passivation layer 204 are gaseous and are pumped out of the vessel 301 through the outlet 303. Thus, material is removed from the portions of the passivation layer 204 which are not covered by the mask 205, and a recess 206 is formed in the passivation layer 204.

In the course of the first etching process, fluorine can be created from the etching gas. The fluorine can be present in atomic or molecular form, or in the form of fluorine ions. Fluorine may react with hydrogenous substances in the mask. In such reactions, gaseous hydrogen fluoride (HF) is created, which is pumped out of the vessel 301 through the outlet 303. Thus, hydrogen contained in the mask 205 scavenges surplus fluorine in the plasma.

The first etching process is stopped prior to a complete removal of the portion of the passivation layer 204 over the contact pad 203. Thus, a residue 207 of the passivation layer 204 remains over the contact pad 203. The etching process can be stopped based on the expiry of a predetermined etching time, or based on measurements of the thickness of the residue 207 of the passivation layer 204, which may be performed by means of interferometric methods known to persons skilled in the art. In other embodiments of the present invention, the passivation layer 204 may comprise an etch stop layer providing an indication that the recess 206 has reached a predetermined depth.

After the first etching process, the mask 205 is removed. The removal of the mask 205 may be performed by means of a reactor similar to the reactor 300 described above with reference to FIG. 3. While in some embodiments of the present invention, the same reactor can be used for the first etching process and the removal of the mask 205, in other embodiments different reactors may be used.

The semiconductor structure 200 is provided on one of the electrodes 304, 305, for example on the second electrode 305. Then, a gas comprising oxygen is flowed into the vessel 301 of the reactor 300.

The power source 308 is activated in order to apply a radio frequency alternating voltage to the electrodes 304, 305. Thus, an electrical discharge is created in the gas, and a plasma comprising oxygen radicals and oxygen ions is generated between the electrodes 304, 305.

The removal of the mask 205 can be performed at a relatively low temperature of the semiconductor structure 200. In some embodiments of the present invention, the temperature of the semiconductor structure 200 can be in a range from about −20° C. to about 100° C., and/or in a range from about 0° C. to about 40° C. In embodiments of the present invention, the temperature of the semiconductor structure 200 can be about room temperature. Further parameters of the removal process, for example a bias voltage applied to the electrodes 304, 305, a pressure of the etching gas, and/or a power of the radio frequency alternating voltage, may be adapted in order to obtain acceptable rates of removal of the mask 205 at the relatively low substrate temperature.

In order to control the temperature of the semiconductor structure 200, the reactor 300 may comprise a temperature controller coupled to the semiconductor structure. The temperature controller may comprise a cooling device and/or a heating device.

Due to the relatively low temperature applied in the removal of the mask 205, rates of chemical reactions between the electrically conductive material in the contact pad 203 and the oxygen are significantly lower than in the method according to the state of the art described above. At a low temperature of the semiconductor structure 200, the diffusion rate of oxygen through the residue 207 of the passivation layer 204 over the contact pad 203 is also lower.

Therefore, significantly less oxide than in the method according to the state of the art described above, or substantially no oxide at all, is formed at the contact pad 203. Consequently, adverse effects of an oxidation of the material of the contact pad 203 such as, e.g., an increase of the contact resistivity between the contact pad 203 and an electrical connection connected thereto, or a reduced adhesion between the contact pad 203 and the electrical connection, are advantageously significantly reduced.

In the removal of the mask 205, a bias voltage can be applied between the electrodes 304, 305 in addition to the radio frequency alternating voltage. The bias voltage is adapted to accelerate oxygen ions in the plasma towards the semiconductor structure 200. For example, the electrode 305 where the semiconductor structure 200 is provided may be negatively charged to attract positively charged ions. Thus, the semiconductor structure 200 is exposed to a bombardment of oxygen ions. The energy of the oxygen ions impinging on the semiconductor structure 200 which have been accelerated in the electrical field created by the bias voltage allows overcoming energy barriers of chemical reactions between the oxygen and the material of the mask 205. Thus, the bias voltage allows a faster removal of the mask 205. The bias voltage may have a value in a range from about −50V to about −150 V.

In some embodiments of the present invention, the semiconductor structure 200 comprises a round semiconductor wafer having a diameter of about 200 mm, and a power of the radio frequency alternating voltage may be in a range from about 100 W to about 500 W. In other embodiments of the present invention, a power of the radio frequency alternating voltage applied in the removal of the mask 205 may be scaled in relation to an area of a surface of the substrate 201. A ratio between the power of the radio frequency alternating voltage and the area of the surface of the substrate can have a value in a range from about 0.32 W/cm$^2$ to about 1.60 W/cm$^2$. In particular embodiments of the present invention, the semiconductor structure 200 comprises a round semiconductor wafer having a diameter of about 300 mm. In the removal of the mask 205, a pressure of the gas may be in a range from about 100 mTorr to about 1000 mTorr The electrical discharge in the reactor 300 can be stopped as soon as the mask 205 is substantially removed from the semiconductor structure 200. In some embodiments of the present invention, the radio frequency alternating voltage and/or the bias voltage are applied for a predetermined time which may be determined experimentally by providing a plurality of test structures similar to the semiconductor structure 200, and exposing each of the test structures to the conditions applied in the removal of the mask 205 for a different time. Then, the test structures may be inspected, for example by means of microscopy, and a time sufficient for the removal of the mask 205 can be established.

In other embodiments of the present invention, an endpoint detection is performed. To this end, an emission intensity representative of a chemical reaction between the material of the mask 205 and the oxygen plasma can be measured during the removal of the mask 205. This may be done by measuring an emission intensity of at least one spectral line emitted by a product of a chemical reaction between the oxygen plasma and the material of the mask 205, which can be done by means of methods known to persons skilled in the art. The emission intensity is a measure for the concentration of the product, which is representative of the rate at which the chemical reaction occurs.

Once the mask 205 is substantially removed, the emission intensity is significantly reduced. This reduction of the emission intensity can be detected by comparing the measured emission intensity with a threshold value which can be determined by means of experiments, wherein a plurality of test structures similar to the semiconductor structure 200 is exposed to the conditions present in the reactor 300 in the removal of the mask for a different time. In doing so, the emission intensity of the spectral line is measured. Thereafter, the test structures are inspected, for example by means of microscopy, in order to relate the emission intensities measured immediately prior to the end of the exposure of the test structure to the oxygen plasma to the presence or absence of the mask 205 or residues thereof, respectively. The threshold value can be determined based on typical values of the emission intensity measured in the absence of residues of the mask 205.

In embodiments of the present invention wherein the mask 205 comprises a photoresist, an emission intensity of a spectral line of carbon monoxide (CO) which is formed in chemical reactions between the oxygen plasma and organic compounds in the photoresist can be measured in order to perform the endpoint detection.

Advantageously, in the removal of the mask 205 described above, substantially no polymeric compounds which may be deposited on the walls of the vessel 301 of the reactor 300 and/or on the semiconductor structure 200 are formed. Therefore, contaminations of the semiconductor structure 200 which may have adverse effects on the functionality of the semiconductor structure 200 may be significantly reduced. Additionally, contaminations of the walls of the vessel 300 are significantly reduced. Thus, the reactor 300 may be operated for a relatively long time between cleaning procedures performed in order to remove such contaminations.

Figure 2C:
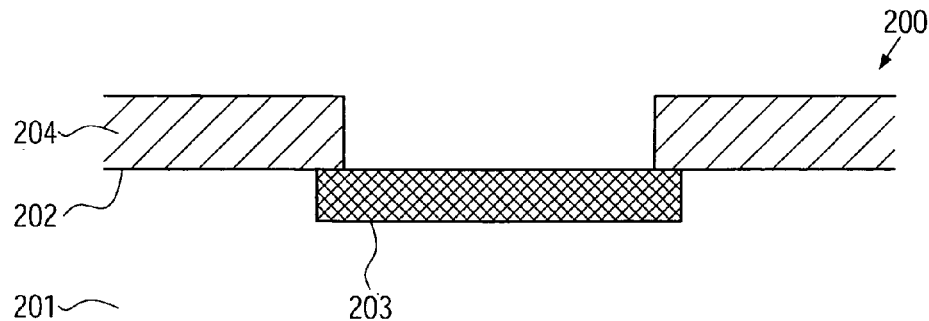

A schematic cross-sectional view of the semiconductor structure 200 in yet another stage of a manufacturing process according to the present invention is shown in FIG. 2c. After the removal of the mask 205, a second etching process adapted to remove the residues 207 of the passivation layer 204 from the contact pad 203 can be performed.

The second etching process can be a dry etching process wherein the semiconductor structure 200 is exposed to an etching gas comprising hydrogen. The hydrogen may be provided in the form of molecular hydrogen ($H_2$), or chemically bound in a hydrogenous substance such as, e.g., difluoromethane ($CH_2F_2$), methyl fluoride ($CH_3F$), methane ($CH_4$), or ammonia ($NH_3$). In some embodiments of the present invention, hydrogen can be provided in the form of a mixture of hydrogen and nitrogen known as "forming gas." For example, the forming gas may comprise a gas blend of about 4% hydrogen in nitrogen. Additionally, the etching gas may comprise fluorine, for example in chemically bound form in compounds such as, for example, difluoromethane ($CH_2F_2$), methyl fluoride ($CH_3F$), or carbon tetrafluoride ($CF_4$). Moreover, the etching gas may comprise oxygen. Advantageously, an addition of oxygen to the etching gas significantly reduces the formation of polymers which helps avoid the formation of contamination layers on the walls of the vessel 301.

An amount of hydrogen in the etching gas can be about equal to an amount of fluorine in the etching gas or greater. Amounts of hydrogen and fluorine may be specified, for example, in terms of numbers of moles of each of the chemical elements. In some embodiments of the present invention, the amount of hydrogen may be greater than about twice the amount of fluorine, greater than about five times the amount of fluorine and/or greater than about ten times the amount of fluorine.

The second etching process can be performed in a reactor similar to the reactor 300 described above with reference to FIG. 3. While in some embodiments of the present invention, the second etching process is performed in the same reactor as the first etching process and/or the removal of the mask 205, in other embodiments different reactors may be used. Advantageously, when the second etching process is performed in the same reactor as the removal of the mask, the plasma comprising oxygen may remove contaminations from the walls of the reactor. This may help in providing a clean chamber and always the same chamber conditions for the second etching process.

The semiconductor structure 200 is provided on one of the electrodes 304, 305, for example on the second electrode 305. Then, an electrical discharge is created in the etching gas by activating the power source 308 to apply a radio frequency alternating voltage and/or a bias voltage to the electrodes 304, 305. The electrical discharge creates a plasma comprising reactive species from the etching gas. The reactive species react chemically with the material of the passivation layer 204, leaving the material of the contact pad 203 substantially intact. Gaseous reaction products leave the vessel 301 through the exhaust port 303.

In the second etching process, the mask 205 is not present anymore. Hence, in contrast to the first etching process, excess fluorine in the plasma is not scavenged by hydrogen contained in the mask 205. Advantageously, providing an amount of hydrogen in the second etching gas being greater than an amount of fluorine insures that there is enough hydrogen in the plasma to scavenge excess fluorine. The excess fluorine reacts chemically with the hydrogen, forming gaseous hydrogen fluoride (HF), which may be pumped out of the vessel 301 through the exhaust port 303. Thus, adverse effects of surplus fluorine such as a formation of fluorides of the material of the contact pad 203, for example the formation of copper fluorides ($CuF_x$) in case the contact pad 203 comprises copper, or a flaking of material layers in the semiconductor structure 200 may advantageously substantially be avoided.

The second etching process may be performed at relatively low temperatures in a range from about −20° C. to about 100° C., and/or in a range from about 0° C. to about 40° C. In some embodiments of the present invention, the second etching process is performed at about room temperature. Thus an oxidation of the material of the contact pad 203 due to chemical reactions with oxygen contained in the etching gas can advantageously be avoided.

Moreover, in the second etching process, the radio frequency alternating voltage may have a relatively low power. In embodiments of the present invention wherein the substrate 201 comprises a round semiconductor wafer having a diameter of about 200 mm, the radio frequency alternating voltage may have a power in a range from about 50 W to about 300 W. In other embodiments of the present invention, the power of the radio-frequency alternating voltage may be scaled in relation to the area of the surface of the substrate 201. A ratio between the power of the radio frequency alternating voltage and the area of the surface of the substrate 201 may have a value in a range from about 0.16 $W/cm^2$ to about 0.95 $W/cm^2$. In particular embodiments of the present invention, the substrate 201 comprises a round semiconductor wafer having a diameter of about 300 mm.

In addition to the radio frequency alternating voltage, in some embodiments of the present invention a bias voltage in the range from about −50V to about −300V may be applied to the electrode 305 on which the substrate 200 is provided.

Like in the removal of the mask 205, in the second etching process, substantially no polymeric by-products are created. Thus, a contamination of the semiconductor structure 200 and/or the reactor 300 by contamination layers comprising polymers can advantageously substantially be avoided. This helps to substantially avoid adverse effects of polymers on the semiconductor structure 200 and also helps to substantially avoid frequent cleanings of the reactor 300.

The second etching process is stopped upon a substantial removal of the residue 207 of the portion of the passivation layer 204 over the contact pad 203. This may be done by performing the second etching process for a predetermined time, or by performing an endpoint detection, as described above.

In the second etching process, both the residue 207 of the portion of the passivation layer 204 over the contact pad 203 and the other portions of the passivation layer 204 which were protected by the mask 205 in the first etching process are affected by the reactive species in the plasma. The corresponding material loss in the other portions of the passivation layer 204 may be taken into account in advance by correspondingly increasing a thickness of the passivation layer.

Figure 2D:
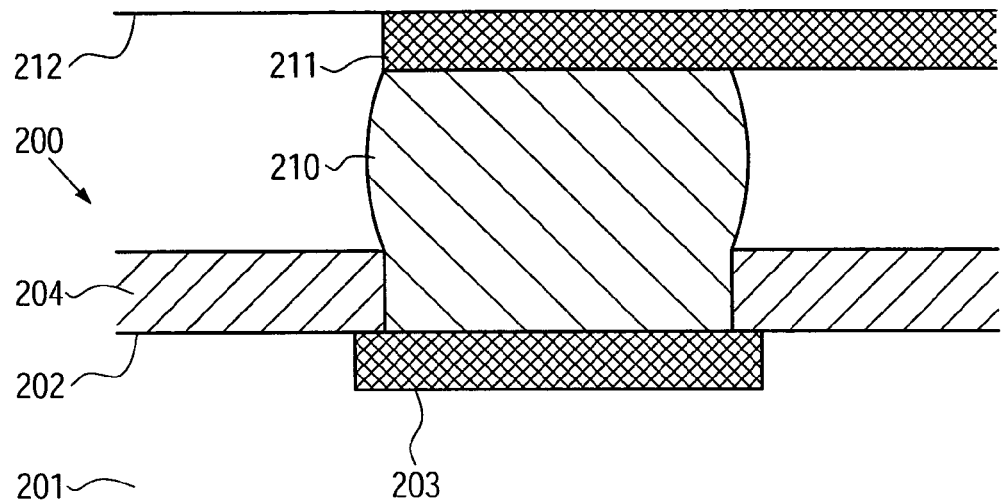

A schematic cross-sectional view of the semiconductor structure 200 in a further stage of a manufacturing process according to the present invention is shown in FIG. 2d. After the second etching process, the contact pad 203 may be used in order to provide an electrical contact to the semiconductor structure 200.

In some embodiments of the present invention, this can be done by forming a bump 210 over the contact pad 203 and then connecting the semiconductor structure 200 to a circuit board 212 comprising a strip conductor 211. This can be done by means of flip-chip techniques known to persons skilled in the art such as solder bumping processes, plated bump flip-chip, gold stud bump flip-chip and adhesive flip-chip. In addition to the bump 210, further bumps may be formed on contact pads of the semiconductor structure 200 other than the contact pad 203. Each of the bumps may then provide electrical contact to one of a plurality of strip conductors in the semiconductor structure 200. Thus, the semiconductor structure 200 may be connected to other electronic components in a circuit. Finally, a space between the semiconductor structure 200 and the circuit board 212 may be filled with an underfill adhesive.

In other embodiments of the present invention, wire bonding techniques known to persons skilled in the art may be used in order to electrically connect the semiconductor structure 200 to other electronic components. In wire bonding, a wire is connected to the contact pad 203, and possibly other wires are connected to other contact pads in the semiconductor structure 200.

As detailed above, the method according to the present invention reduces the formation of oxides and fluorides of materials of the contact pad 203 and other contact pads in the semiconductor structure. Since such oxides and fluorides may reduce an adhesion between the bump 210 and the contact pad 203, or an adhesion between the contact pad 203 and a wire bonded thereto, the present invention allows improved adhesion between the contact pad 203 and other electrical elements connected thereto. Furthermore, compared to a semiconductor structure formed by means of methods according to the state of the art, in the present invention, leakage currents can be reduced and a contact resistivity between the contact pad 203 and an electrical element such as a bump or wire connected thereto is advantageously reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a semiconductor structure, comprising:
providing a substrate comprising at least one contact pad;
forming a passivation layer over said substrate;
forming a mask over said passivation layer, wherein said mask does not cover a portion of said passivation layer located over said at least one contact pad;
performing an etching process adapted to remove at least a portion of said passivation layer; and
removing said mask, said removal of said mask comprising exposing said substrate to a gas comprising oxygen, said removal of said mask being performed at a temperature of said substrate in a range from about 0° C. to about 40° C.

2. The method of claim 1, wherein said removal of said mask further comprises creating an electrical discharge in said gas.

3. The method of claim 2, wherein said creation of said electrical discharge comprises applying a radio frequency alternating voltage, a ratio between a power of said radio frequency alternating voltage and an area of a surface of said substrate having a value in a range from about 0.32 W/cm$^2$ to about 1.60 W/cm$^2$.

4. The method of claim 3, further comprising applying a bias voltage adapted to accelerate oxygen ions towards said substrate.

5. The method of claim 4, wherein said bias voltage has a value in a range from about −50V to about −100 V.

6. The method of claim 1, wherein said removal of said mask is performed at a pressure of said gas in a range from about 100 mTorr to about 1000 mTorr.

7. The method of claim 1, further comprising performing a second etching process adapted to remove residues of said passivation layer from said at least one contact pad.

8. The method of claim 7, wherein said second etching process comprises exposing said substrate to a gaseous etchant comprising hydrogen and fluorine, an amount of hydrogen in said gaseous etchant being at least equal to an amount of fluorine in said gaseous etchant.

9. The method of claim 8, wherein said amount of hydrogen is greater than about twice said amount of fluorine.

10. The method of claim 9, wherein said amount of hydrogen is greater than about five times said amount of fluorine.

11. The method of claim 10, wherein said amount of hydrogen is greater than about ten times said amount of fluorine.

12. The method of claim 8, wherein said gaseous etchant comprises a hydrogenous substance comprising at least one of hydrogen ($H_2$), methyl fluoride ($CH_3F$), methane ($CH_4$), or ammonia ($NH_3$).

13. The method of claim 8, wherein said gaseous etchant comprises a mixture of hydrogen ($H_2$) and nitrogen ($N_2$).

14. The method of claim 1, further comprising forming a bump over said contact pad.

15. The method of claim 1, further comprising bonding a wire to said contact pad.

16. A method of forming a semiconductor structure comprising:
providing a substrate comprising at least one contact pad;
forming a passivation layer over said substrate;
forming a mask over said passivation layer, wherein said mask does not cover a portion of said passivation layer located over said at least one contact pad;
performing a first etching process adapted to remove at least a portion of said passivation layer;
removing said mask; and
performing a second etching process adapted to remove residues of said passivation layer from said at least one contact pad, said second etching process comprising exposing said substrate to a gaseous etchant comprising hydrogen and fluorine, an amount of hydrogen in said etching gas being at least equal to an amount of fluorine in said etching gas, wherein said second etching process is performed at a temperature of said substrate in a range from about −20° C. to about 100° C.

17. The method of claim 16, wherein said amount of hydrogen is greater than about twice said amount of fluorine.

18. The method of claim 17, wherein said amount of hydrogen is greater than about five times said amount of fluorine.

19. The method of claim 18, wherein said amount of hydrogen is greater than about ten times said amount of fluorine.

20. The method of claim 16, wherein said gaseous etchant comprises a hydrogenous substance comprising at least one of hydrogen ($H_2$), difluoromethane ($CH_2F_2$), methyl fluoride ($CH_3F$), methane ($CH_4$), or ammonia ($NH_3$).

21. The method of claim 16, wherein said gaseous etchant comprises a mixture of hydrogen ($H_2$) and nitrogen ($N_2$).

22. The method of claim 16, wherein said second etching process comprises creating an electric discharge in said gaseous etchant.

23. The method of claim 22, wherein said creation of said electric discharge comprises applying a radio frequency alternating voltage, a ratio between a power of said radio frequency alternating voltage and an area of a surface of said substrate having a value in a range from about 0.16 W/cm$^2$ to about 0.95 W/cm$^2$.

24. The method of claim 22, further comprising applying a bias voltage adapted to accelerate ions towards said substrate.

25. The method of claim 24, wherein said bias voltage has a value in a range from about −50 V to about 300 V.

26. The method of claim 16, wherein said second etching process is performed at a temperature of said substrate in a range from about 0° C. to about 40° C.

27. The method of claim 16, further comprising forming at least one bump over said at least one contact pad.

28. The method of claim 16, further comprising bonding at least one wire to said at least one contact pad.

29. A method of forming a semiconductor structure, comprising:
providing a substrate comprising at least one contact pad;
forming a passivation layer over said substrate;
forming a mask over said passivation layer, wherein said mask does not cover a portion of said passivation layer located over said at least one contact pad;
performing an etching process adapted to remove at least a portion of said passivation layer;
removing said mask, said removal of said mask comprising exposing said substrate to a gas comprising oxygen, said removal of said mask being performed at a temperature of said substrate in a range from about −20° C. to about 100° C.; and
bonding a wire to said contact pad.

30. A method of forming a semiconductor structure comprising:
providing a substrate comprising at least one contact pad;
forming a passivation layer over said substrate;
forming a mask over said passivation layer, wherein said mask does not cover a portion of said passivation layer located over said at least one contact pad;
performing a first etching process adapted to remove at least a portion of said passivation layer;
removing said mask;
performing a second etching process adapted to remove residues of said passivation layer from said at least one contact pad, said second etching process comprising exposing said substrate to a gaseous etchant comprising hydrogen and fluorine, an amount of hydrogen in said etching gas being at least equal to an amount of fluorine in said etching gas; and
bonding at least one wire to said at least one contact pad.

31. A method of forming a semiconductor structure, comprising:
providing a substrate comprising at least one contact pad;
forming a passivation layer over said substrate;
forming a mask over said passivation layer, wherein said mask does not cover a portion of said passivation layer located over said at least one contact pad;
performing a first etching process to remove at least some, but not all, of said passivation layer positioned above said at least one contact pad, said first etching process resulting in portions of said passivation layer remaining above said at least one contact pad;
removing said mask, said removal of said mask comprising exposing said substrate to a gas comprising oxygen, said removal of said mask being performed at a temperature of said substrate in a range from about −20° C. to about 100° C.; and
performing a second etching process to remove said portions of said passivation layer from above said at least one contact pad.

32. The method of claim 31, wherein said removal of said mask is performed at a temperature of said substrate in a range from about 0° C. to about 40° C.

33. The method of claim 31, wherein said removal of said mask further comprises creating an electrical discharge in said gas.

34. The method of claim 33, wherein said creation of said electrical discharge comprises applying a radio frequency alternating voltage, a ratio between a power of said radio frequency alternating voltage and an area of a surface of said substrate having a value in a range from about 0.32 W/cm$^2$ to about 1.60 W/cm$^2$.

35. The method of claim 34, further comprising applying a bias voltage adapted to accelerate oxygen ions towards said substrate.

36. The method of claim 35, wherein said bias voltage has a value in a range from about −50V to about −100 V.

37. The method of claim 31, wherein said removal of said mask is performed at a pressure of said gas in a range from about 100 mTorr to about 1000 mTorr.

38. The method of claim 31, wherein said second etching process comprises exposing said substrate to a gaseous etchant comprising hydrogen and fluorine, an amount of hydrogen in said gaseous etchant being about equal to at least an amount of fluorine in said gaseous etchant.

39. The method of claim 38, wherein said amount of hydrogen is greater than about twice said amount of fluorine.

40. The method of claim 39, wherein said amount of hydrogen is greater than about five times said amount of fluorine.

41. The method of claim 40, wherein said amount of hydrogen is greater than about ten times said amount of fluorine.

42. The method of claim 38, wherein said gaseous etchant comprises a hydrogenous substance comprising at least one of hydrogen ($H_2$), methyl fluoride ($CH_3F$), methane ($CH_4$), or ammonia ($NH_3$).

43. The method of claim 38, wherein said gaseous etchant comprises a mixture of hydrogen ($H_2$) and nitrogen ($N_2$).

44. The method of claim 31, further comprising forming a bump over said contact pad.

45. The method of claim 31, further comprising bonding a wire to said contact pad.

\* \* \* \* \*